US010475725B2

(12) United States Patent
Kande et al.

(10) Patent No.: US 10,475,725 B2
(45) Date of Patent: Nov. 12, 2019

(54) STRUCTURE TO ENABLE HIGHER CURRENT DENSITY IN INTEGRATED CIRCUIT RESISTOR

(71) Applicant: Texas Instruments Incorporated, Dallas, TX (US)

(72) Inventors: Dhishan Kande, Dallas, TX (US); Archana Venugopal, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/807,370

(22) Filed: Nov. 8, 2017

(65) Prior Publication Data

US 2019/0139861 A1 May 9, 2019

(51) Int. Cl.

| | |
|---|---|
| ***H01L 23/42*** | (2006.01) |
| ***H01L 49/02*** | (2006.01) |
| ***H01L 23/485*** | (2006.01) |
| ***H01L 23/522*** | (2006.01) |
| ***H01L 21/768*** | (2006.01) |

(52) U.S. Cl.

CPC ............ *H01L 23/42* (2013.01); *H01L 21/768* (2013.01); *H01L 23/485* (2013.01); *H01L 23/5228* (2013.01); *H01L 28/20* (2013.01)

(58) Field of Classification Search

CPC ......... H01L 2924/0002; H01L 2924/00; H01L 23/367; H01L 23/3735; H01L 23/5228; H01L 27/0629; H01L 28/20

See application file for complete search history.

(56) References Cited

U.S. PATENT DOCUMENTS

| | | | |
|---|---|---|---|
| 6,100,199 A | 8/2000 | Joshi | |
| 6,525,419 B1 * | 2/2003 | Deeter | H01L 23/367 257/625 |
| 6,800,886 B2 | 10/2004 | Awano | |
| 7,161,240 B2 | 1/2007 | Barcley | |
| 7,166,913 B2 | 1/2007 | Chinthakindi | |
| 7,345,364 B2 | 3/2008 | Kerr | |
| 7,528,048 B2 | 5/2009 | Coolbaugh | |
| 8,230,586 B2 | 7/2012 | Coolbaugh | |
| 8,486,796 B2 | 7/2013 | Harmon | |
| 8,592,947 B2 | 11/2013 | Lukaitis | |
| 8,946,857 B2 | 2/2015 | Igeta | |
| 9,337,088 B2 | 5/2016 | Clark, Jr. | |
| 9,543,228 B2 | 1/2017 | Kanda | |
| 2006/0231945 A1 * | 10/2006 | Chinthakindi | H01L 23/3677 257/712 |

(Continued)

*Primary Examiner* — Jaehwan Oh

(74) *Attorney, Agent, or Firm* — Jacqueline J. Garner; Charles A. Brill; Frank D. Cimino

(57) ABSTRACT

An integrated circuit has a substrate including semiconductor material and a resistor in an interconnect region, above a first level of interconnect lines. The integrated circuit further includes an electrically isolated thermal conduit having one or more interconnect lines in every interconnect level lower than the resistor. The interconnect lines of the thermal conduit are directly connected through one or more vertical interconnects, including contacts, and possibly vias, to a gate structure located on a dielectric material over the semiconductor material of the substrate. The thermal conduit is electrically isolated from the resistor, from all active components in the integrated circuit, and from the semiconductor material of the substrate.

15 Claims, 12 Drawing Sheets

(56) References Cited

U.S. PATENT DOCUMENTS

2007/0284662 A1 12/2007 Chinthakindi
2011/0073957 A1* 3/2011 Chiu .................. H01L 27/0629
257/380
2011/0140279 A1 6/2011 Anderson
2015/0237709 A1 8/2015 Mittal

* cited by examiner 200
212
202
214
206
204
220
220
220
222
210
208
230
232

400
440
438
414
406
404
420
412
402
424
426
430
420
422
432
436
410
434
408

STRUCTURE TO ENABLE HIGHER CURRENT DENSITY IN INTEGRATED CIRCUIT RESISTOR

FIELD OF THE INVENTION

This invention relates to the field of integrated circuits. More particularly, this invention relates to resistors in integrated circuits.

BACKGROUND OF THE INVENTION

Resistors in integrated circuits are commonly minimized in area to save space in the integrated circuit. Limits to reducing the resistor area are frequently encountered due to temperature increases in the resistor by joule heating during operation of the integrated circuit, resulting in excessive non-linearity or reduced reliability from electromigration. Efforts have been made to remove heat from the resistors to enable operation at higher current densities. A popular scheme is to form thermal sinks from the resistor to the substrate of the integrated circuit. These thermal sinks undesirably add significant capacitive loads to the resistor, and may not be suitable for precision circuits or high frequency circuits. Other schemes to remove heat from the resistors typically involve extra fabrication steps and so undesirably increase costs of the integrated circuits.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit has a substrate including semiconductor material and an interconnect region over the substrate. The integrated circuit includes a resistor in the interconnect region, above a first level of interconnect lines. The integrated circuit further includes an electrically isolated thermal conduit having interconnect lines at least partially below the resistor. The electrically isolated thermal conduit includes interconnect lines in every interconnect level lower than the resistor. The interconnect lines of the electrically isolated thermal conduit are thermally coupled through vertical interconnects to a gate structure located on a dielectric material over the semiconductor material of the substrate. The thermal conduit is electrically isolated from the resistor and from the semiconductor material of the substrate.

DETAILED DESCRIPTION OF EXAMPLE EMBODIMENTS

Figure 1:
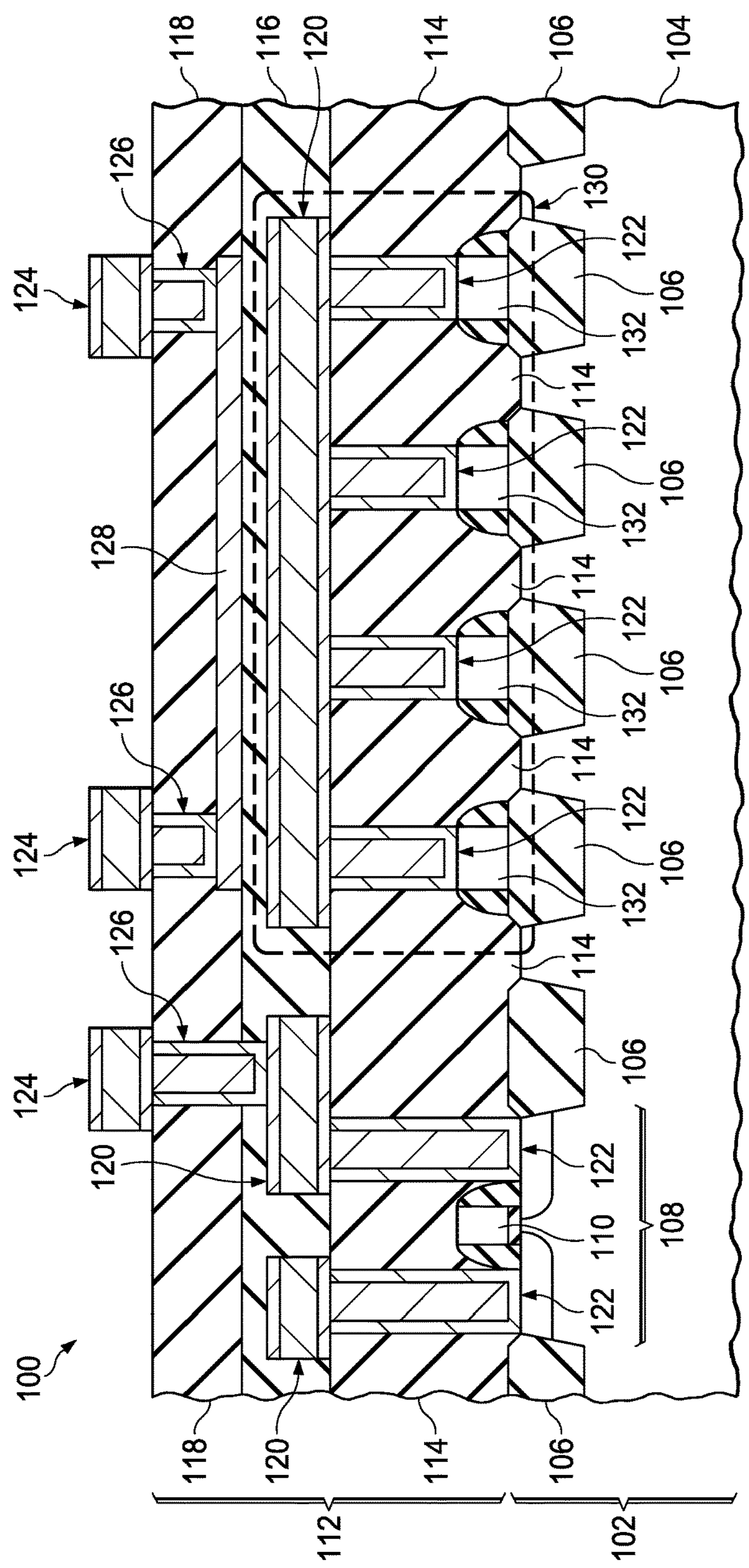
FIG. 1 is a cross section of an example integrated circuit including a resistor and a thermal conduit.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit has a substrate including semiconductor material and an interconnect region over the substrate. The interconnect region includes one or more interconnect levels containing interconnect lines. The interconnect region further includes vertical interconnects. The vertical interconnects include vias that electrically couple interconnect lines in sequential interconnect levels. The vertical interconnects further include contacts that electrically couple interconnect lines in a first, lowest, interconnect level to active components in and on the substrate, for example, metal oxide semiconductor (MOS) transistors. The integrated circuit includes a resistor in the interconnect region, higher than the first interconnect level. The resistor may be located, for example, higher than the first interconnect level and lower than a second interconnect level, or higher than the second interconnect level and lower than a third interconnect level.

The integrated circuit further includes an electrically isolated thermal conduit, hereinafter the thermal conduit, located at least partially under the resistor. The thermal conduit includes interconnect lines of every interconnect level lower than the resistor. The interconnect lines of the thermal conduit are thermally coupled through instances of the vertical interconnects, that is, the contacts and the vias, to a gate structure located on a dielectric material over the semiconductor material of the substrate. The thermal conduit is electrically isolated from the resistor, from the semiconductor material of the substrate, and from any active components of the integrated circuit, that is, the integrated circuit is free of direct connections between the thermal conduit and the resistor and the semiconductor material, through electrically conductive elements.

The term "active component" is understood to apply to components having members or regions in the semiconductor material of the substrate. Examples of active components are transistors and diodes.

For the purposes of this disclosure, the term "lateral" is understood to refer to a direction parallel to a plane of a top surface of the substrate. The term "vertical" is understood to refer to a direction perpendicular to the plane of the top surface of the substrate.

It is noted that terms such as top, bottom, over, above, under, below, down, higher, and lower may be used in this disclosure. These terms should not be construed as limiting the position or orientation of a structure or element, but should be used to provide spatial relationship between structures or elements.

For the purposes of this disclosure, the term "substantially equal" as applied to quantities, physical parameters, structures, and elements formed in an integrated circuit may be understood as equal within fabrication tolerances encountered when designing and fabricating the integrated circuit. The term "substantially equal" may also be understood as equal within measurement errors that are normally encountered when measuring the quantities, physical parameters, structures, and elements.

For the purposes of this disclosure, it will be understood that, if an element is referred to as being "connected" or "coupled" to another element, it may be directly connected or directly coupled to the other element, or intervening elements may be present. If an element is referred to as being "directly coupled" or "directly connected" to another element, it is understood there are no other intentionally disposed intervening elements present.

FIG. 1 is a cross section of an example integrated circuit including a resistor and a thermal conduit. The integrated circuit 100 includes a substrate 102 with a semiconductor material 104 such as silicon or other type IV semiconductor material, or gallium nitride or other type III-V semiconductor material. Other semiconductor materials are within the scope of the instant example. The substrate 102 may be a portion of a semiconductor wafer, such as a silicon wafer, a silicon-on-insulator (SOI) wafer, a silicon wafer with a silicon epitaxial layer, or a wafer with an epitaxial layer of one or more type III-V semiconductor materials. In the instant example, the substrate 102 includes field oxide 106 over portions of the semiconductor material 104. The field oxide 106 may have a shallow trench isolation (STI) structure in which silicon dioxide is disposed in trenches in the substrate 102, as depicted in FIG. 1. Alternatively, the field oxide 106 may have a local oxidation of silicon (LOCOS) structure with tapered edges.

The integrated circuit 100 includes active components, represented by an MOS transistor 108. The MOS transistor 108 with a gate 110 is disposed in and on the substrate 102. The gate 110 may include polycrystalline silicon, commonly referred to a polysilicon, may include metal silicide such as tungsten silicide, platinum silicide, titanium silicide, cobalt silicide, or nickel silicide, or may include metals such as titanium, tantalum, titanium nitride, or tantalum nitride, appropriate for a metal gate transistor. Other active components with gates, such as insulated gate bipolar transistors, or variable reactance capacitors, commonly referred to as varactors, are within the scope of the instant example.

The integrated circuit 100 includes an interconnect region 112 above the substrate 102. In the instant example, the interconnect region 112 includes a pre-metal dielectric (PMD) layer 114 on the substrate 102. The PMD layer 114 may include one or more sub-layers of dielectric material, for example a PMD liner of silicon nitride on the substrate 102, a layer of silicon dioxide-based material, a layer of phosphosilicate glass (PSG) or borophosphosilicate glass (BPSG), and a cap layer of silicon nitride, silicon oxynitride, silicon carbide or silicon carbide nitride.

The interconnect region 112 of the instant example further includes an intra-metal dielectric (IMD) layer 116 over the PMD layer 114 and an inter-level dielectric (ILD) layer 118 over the IMD layer 116. The IMD layer 116 may include one or more sublayers of dielectric material, for example an etch stop layer of silicon nitride, and a main dielectric layer of silicon dioxide or low-k dielectric material on the etch stop layer. A top surface of the IMD layer 116 may be planar, as indicated in FIG. 1. The ILD layer 118 may include one or more dielectric sublayers, such as a main dielectric layer of silicon dioxide or low-k dielectric material on the IMD layer 116, and a cap layer of silicon nitride, silicon carbide, silicon oxy-nitride, silicon oxy-carbide, or the like, on the main dielectric layer. Other dielectric layer structures for the PMD layer 114, the IMD layer 116, and the ILD layer 118 are within the scope of the instant example.

The integrated circuit 100 includes a first interconnect level containing first interconnect lines 120 on the PMD layer 114 and in the IMD layer 116. Each of the first interconnect lines 120 may have a layered structure, including an adhesion layer containing titanium on the PMD layer 114, an aluminum-containing layer on the adhesion layer, and a cap layer of titanium nitride on the aluminum-containing layer, as depicted in FIG. 1. Other structures and compositions for the first interconnect lines 120 are within the scope of the instant example.

Instances of the first interconnect lines 120 are electrically coupled to component members in and on the substrate 102, such as the MOS transistor 108 through contacts 122 which extend vertically through the PMD layer 114. Each of the contacts 122 may have a liner of titanium and titanium nitride contacting the PMD layer 114, and a core of tungsten on the liner, as depicted in FIG. 1. Other structures and compositions for the contacts 122 are within the scope of the instant example.

The integrated circuit 100 of the instant example further includes a second interconnect level containing second interconnect lines 124 on the ILD layer 118. The second interconnect lines 124 may have a structure and a composition similar to the first interconnect lines 120. Instances of the second interconnect lines 124 are electrically coupled to instances of the first interconnect lines 120 through vias 126 which extend vertically through the ILD layer 118 and the IMD layer 116. Each of the vias 126 may have a liner containing a barrier metal of titanium nitride or tantalum nitride contacting the ILD layer 118 and the IMD layer 116, and a core of tungsten on the liner, as depicted in FIG. 1. Alternatively, each of the vias 126 may have a liner of barrier metal and a core of aluminum. Other structures and compositions for the vias 126 are within the scope of the instant example.

The integrated circuit 100 includes a resistor 128 in the interconnect region 112. In the instant example, the resistor 128 is located higher than the first interconnect lines 120 and lower than the second interconnect lines 124. The resistor may be located on the IMD layer 116, as depicted in FIG. 1. The resistor 128 may include, for example, a thin film resistor body and resistor heads in contact with the resistor body. In another example, the resistor 128 may have a single layer of resistive material which provides both the resistor body and the resistor heads, as depicted in FIG. 1. Other structures for the resistor 128 are within the scope of the instant example. In the instant example, instances of the second interconnect lines 124 are electrically coupled to the resistor 128 through instances of the vias 126. Other configurations for electrically coupling to the resistor 128 are within the scope of the instant example.

The integrated circuit 100 includes a thermal conduit 130 in the interconnect region 112. In the instant example, the thermal conduit 130 includes one or more of the first interconnect lines 120 directly under the resistor 128. In the instant example, the thermal conduit 130 includes one of the first interconnect lines 120, which spans the lateral extents of the resistor 128. The thermal conduit 130 includes one or more of the contacts 122. The contacts 122 of the thermal conduit 130 are directly connected to the first interconnect line 120 of the thermal conduit 130. The thermal conduit 130 further includes a gate structure 132 which has a composition and structure similar to the gate 110 of the MOS transistor 108, as a result of being formed concurrently. The contacts 122 of the thermal conduit 130 are directly connected to the gate structure 132. In the instant example, the gate structure 132 is disposed on the field oxide 106. The thermal conduit 130 is electrically isolated from the resistor 128. In the instant example, a portion of the ILD layer 118 separates the thermal conduit 130 from the resistor 128. The thermal conduit 130 is electrically isolated from the semiconductor material 104 of the substrate 102. The thermal conduit 130 is also electrically isolated from all active components of the integrated circuit 100.

The field oxide 106 under the thermal conduit 130 may have an area density that does not reduce process latitude when forming the field oxide 106, and specifically does not reduce process latitude for an oxide chemical mechanical polish (CMP) process used to form the field oxide 106. The field oxide 106 under the thermal conduit 130 may have an area density of, for example, 50 percent to 150 percent of an average area density of the field oxide 106 in the integrated circuit 100, which has been demonstrated to avoid reduction of process latitude for the oxide CMP process.

Similarly, the gate structure 132 of the thermal conduit 130 may have an area density that does not reduce process latitude for the photolithographic operation to form a gate etch mask and when etching a gate layer to form gates of MOS transistors, including the gate 110, and concurrently forming the gate structure 132. The gate structure 132 may have an area density of, for example, 50 percent to 150 percent of an average area density of gates in the integrated circuit 100, which has been demonstrated to avoid reduction of process latitude for the photolithographic operation to form the gate etch mask and for the etch process to form the gates 110 and the gate structure 132.

Furthermore, the contacts 122 of the thermal conduit 130 may have an area density that does not reduce process latitude for the photolithographic operation to form a contact etch mask, when etching contact holes through the PMD layer 114, and when forming the liners and cores in the contacts 122. The contacts 122 may have an area density of, for example, 50 percent to 150 percent of an average area density of the contacts 122, which has been demonstrated to avoid reduction of process latitude for the operations to form the contacts 122.

In the instant example, the thermal conduit 130 is thermally coupled to the resistor 128 and to the semiconductor material 104. During operation of the integrated circuit 100, current may flow through the resistor 128, generating heat in the resistor 128 which flows into the interconnect region 112. A portion of the heat generated by the resistor 128 may flow into the first interconnect line 120 of the thermal conduit 130, and may subsequently be conducted to the gate structure 132, and then conducted into the substrate 102. Conducting the portion of the heat generated by the resistor 128 through the thermal conduit 130 may advantageously reduce a temperature of the resistor 128. Simulations of integrated circuits similar to the integrated circuit 100 of the instant example have indicated a temperature rise in the resistor 128 may be reduced by 30 percent to 60 percent compared to a similar integrated circuit with no thermal conduit. An area of the gate structure 132, and an area of the first interconnect line 120 of the thermal conduit 130 under the resistor 128, may be selected to limit a capacitance between the resistor 128 and the semiconductor material 104 of the substrate 102 to a desired value.

Figure 2A:
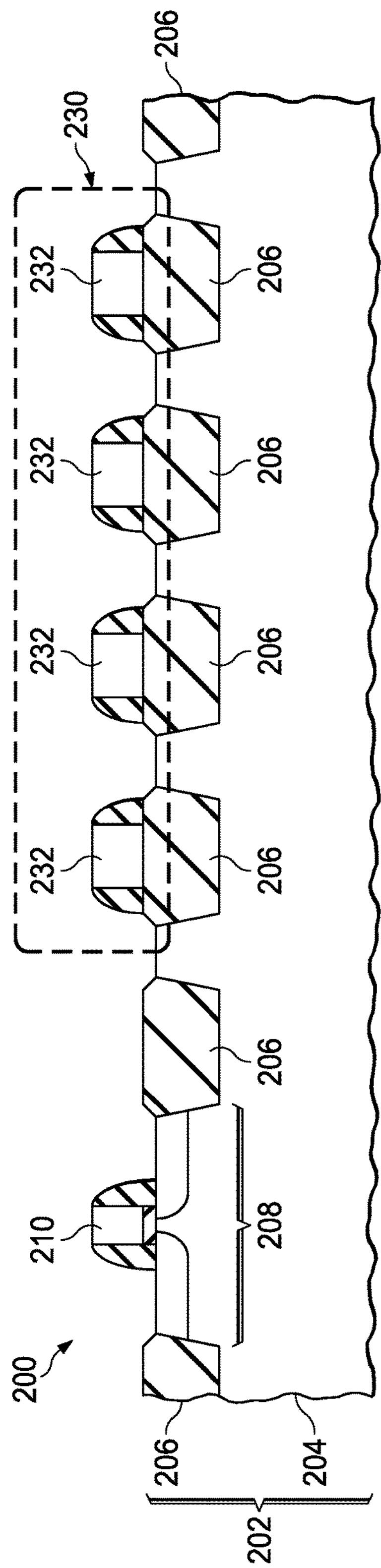
FIG. 2A through FIG. 2D are cross sections of an integrated circuit with a resistor and a thermal conduit under the resistor, depicted in steps of an example method of formation.

FIG. 2A through FIG. 2D are cross sections of an integrated circuit with a resistor and a thermal conduit under the resistor, depicted in steps of an example method of formation. Referring to FIG. 2A, a substrate 202 is provided for formation of the integrated circuit 200. The substrate 202 may be, for example, a semiconductor wafer, such as a silicon wafer, an SOI wafer, a silicon wafer with a silicon epitaxial layer, or a wafer with an epitaxial layer of one or more type III-V semiconductor materials. The substrate 202 includes semiconductor material 204 such as silicon or other type IV semiconductor material, or gallium nitride or other type III-V semiconductor material. Other semiconductor materials are within the scope of the instant example.

Field oxide 206 may be formed in the substrate 202, in an area for the thermal conduit 230 and in other areas, for example to laterally isolate components of the integrated circuit 200. The field oxide 206 may be formed by an STI process. An example STI process includes forming a CMP stop layer of silicon nitride over the substrate 202, etching isolation trenches through the CMP stop layer and into the semiconductor material 204, and filling the isolation trenches with silicon dioxide using a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (APCVD) process using silane, or a sub-atmospheric chemical vapor deposition (SACVD) process using dichlorosilane. Excess silicon dioxide is removed from over the CMP stop layer by an oxide CMP process, and the CMP stop layer is subsequently removed, leaving the field oxide 206. The oxide CMP process may be sensitive to an area density of the field oxide 206, in that it may be difficult to remove sufficient silicon dioxide in regions with high area densities of the field oxide 206 before overpolishing in regions with low area densities of the field oxide 206. An area density of the field oxide 206 under the thermal conduit 230 may be designed to be 50 percent to 150 percent of an average area density of the field oxide 206 in the integrated circuit 200, which has been demonstrated to avoid insufficient silicon dioxide removal, and avoid overpolishing, for the oxide CMP process.

Alternatively, the field oxide 206 may be formed by a LOCOS process. An example LOCOS process includes forming a silicon nitride mask layer over a layer of LOCOS pad oxide over the substrate 202. The silicon nitride mask layer is removed in areas for the field oxide 206, exposing the LOCOS pad oxide. Silicon dioxide is formed in the areas exposed by the silicon nitride mask layer by thermal oxidation, to form the field oxide 206. The silicon nitride mask layer is subsequently removed, leaving the field oxide 206 in place.

Components, represented in the instant example by an MOS transistor 208, are formed in and on the substrate 202. A gate 210 of the MOS transistor 208 and a gate structure 232 of the thermal conduit 230 are formed concurrently over the substrate 202. In one version of the instant example, the gate 210 and the gate structure 232 may be formed by forming a polysilicon layer over the substrate 202, and subsequently forming a gate etch mask over the polysilicon layer. A gate reactive ion etch (RIE) process then removes the polysilicon layer where exposed by the gate etch mask, leaving the gate 210 and the gate structure 232 in place. A conformal layer of dielectric material such as silicon nitride may be formed over the gate 210 and the gate structure 232. A subsequent anisotropic etch removes the dielectric material from tops of the gate 210 and the gate structure 232, leaving gate sidewall spacers on lateral surfaces of the gate 210 and the gate structure 232. In another version of the instant example, the gate 210 and the gate structure 232 may be formed by forming a dielectric layer over the substrate 202, and removing material from the dielectric layer in areas for the gate 210 and the gate structure 232. Gate material, such as metal layers including titanium, titanium nitride, tantalum, tantalum nitride, or aluminum, is formed over the dielectric layer and in the areas for the gate 210 and the gate structure 232. The gate material is subsequently removed from over the dielectric layer, leaving the gate 210 and the gate structure 232 in place. Other methods of forming the gate 210 and the gate structure 232, such as a fully silicided (FUSI) gate process, are within the scope of the instant example.

Figure 2B:
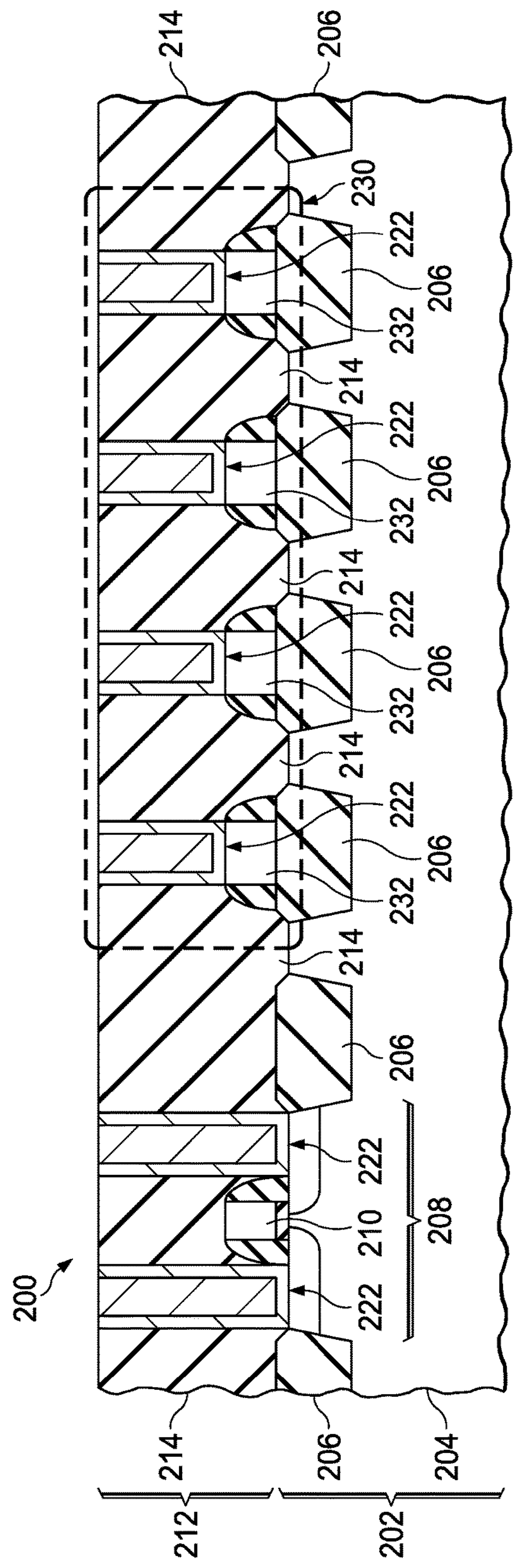

Referring to FIG. 2B, a PMD layer 214 of an interconnect region 212 is formed over that substrate 202 and over the gate 210 and the gate structure 232. The PMD layer 214 may include one or more sub-layers of dielectric material formed by a sequence of PECVD processes. For example, the PMD layer 214 may include a PMD liner of silicon nitride formed on the substrate 202, and on the gate 210 and the gate structure 232, by a PECVD process using silane and ammonia. The PMD layer 214 may include a layer of silicon dioxide-based material formed by an HDP or a PECVD process using TEOS and ozone, which fills spaces between the gate 210 and the gate structure 232, and which is subsequently planarized by an oxide CMP process. The PMD layer 214 may include a layer of PSG or BPSG formed by another PECVD process using TEOS, and a cap layer of silicon nitride, silicon oxynitride, silicon carbide, or silicon carbide nitride, formed by a further ECVD process.

Contacts 222 are formed through the PMD layer 214 to make connections to the components such as the MOS transistor 208, and as part of the thermal conduit 230 to make connections to the gate structure 232. The contacts 222 may be formed by etching contact holes through the PMD layer 214, and forming a titanium liner, by sputtering or an ionized metal plasma (IMP) process, on the PMD layer 214 and extending into the contact holes. A titanium nitride liner is formed, by reactive sputtering or atomic layer deposition (ALD), on the titanium liner. A layer of tungsten is formed, by a metal organic chemical vapor deposition (MOCVD) process, on the titanium nitride liner, filling the contact holes. The tungsten, titanium nitride, and titanium are removed from over a top surface of the PMD layer 214 by a metal CMP process, leaving the tungsten core, titanium nitride liner and titanium liner in the contact holes to provide the contacts 222.

Figure 2C:
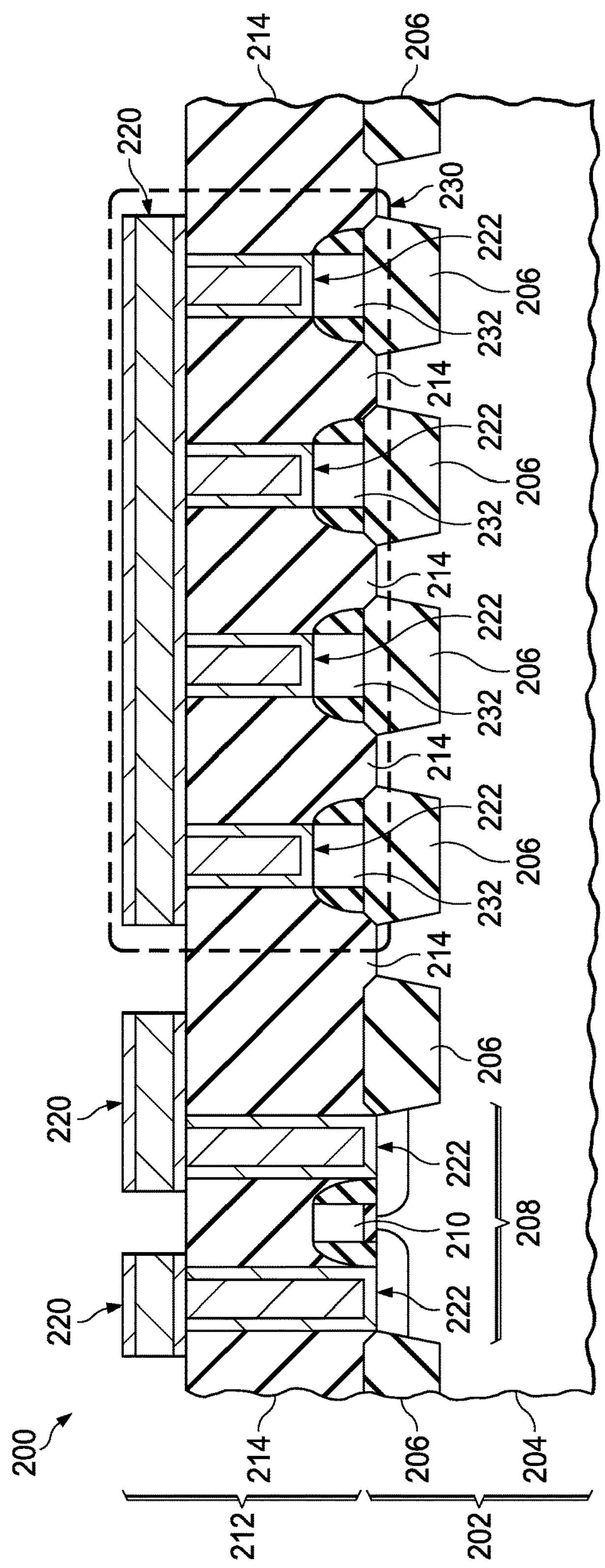

Referring to FIG. 2C, first interconnect lines 220 of a first interconnect level of the interconnect region 212 are formed over the PMD layer 214, making connections to the contacts 222. One or more of the first interconnect lines 220 are part of the thermal conduit 230. Other instances of the first interconnect lines 220 provide electrical connections to the components of the integrated circuit 200, such as the MOS transistor 208. The first interconnect lines 220 may be formed by forming an interconnect metal layer stack, including an adhesion layer containing titanium, titanium nitride, or titanium tungsten, by a sputter process or a reactive sputter process, on the PMD layer 214, and on tops of the contacts 222. The interconnect metal layer stack also includes an aluminum layer formed by a sputter process on the adhesion layer. The aluminum layer may include a few percent silicon, titanium, and/or copper, to reduce electromigration. The interconnect metal layer stack further includes an anti-reflection layer containing titanium nitride formed by a reactive sputter process or an ALD process on the aluminum layer. An etch mask which includes a photoresist pattern is formed by a photolithographic process over the anti-reflection layer to cover areas for the first interconnect lines 220. The etch mask may include a separate anti-reflection layer of silicon nitride or silicon oxy-nitride under a photoresist pattern. Alternatively, the etch mask may include an organic anti-reflection layer under the photoresist pattern, commonly referred to as a bottom anti-reflection coat (BARC). The interconnect metal layer stack is removed where exposed by the etch mask by an RIE process using chlorine, to form the first interconnect lines 220.

Figure 2D:
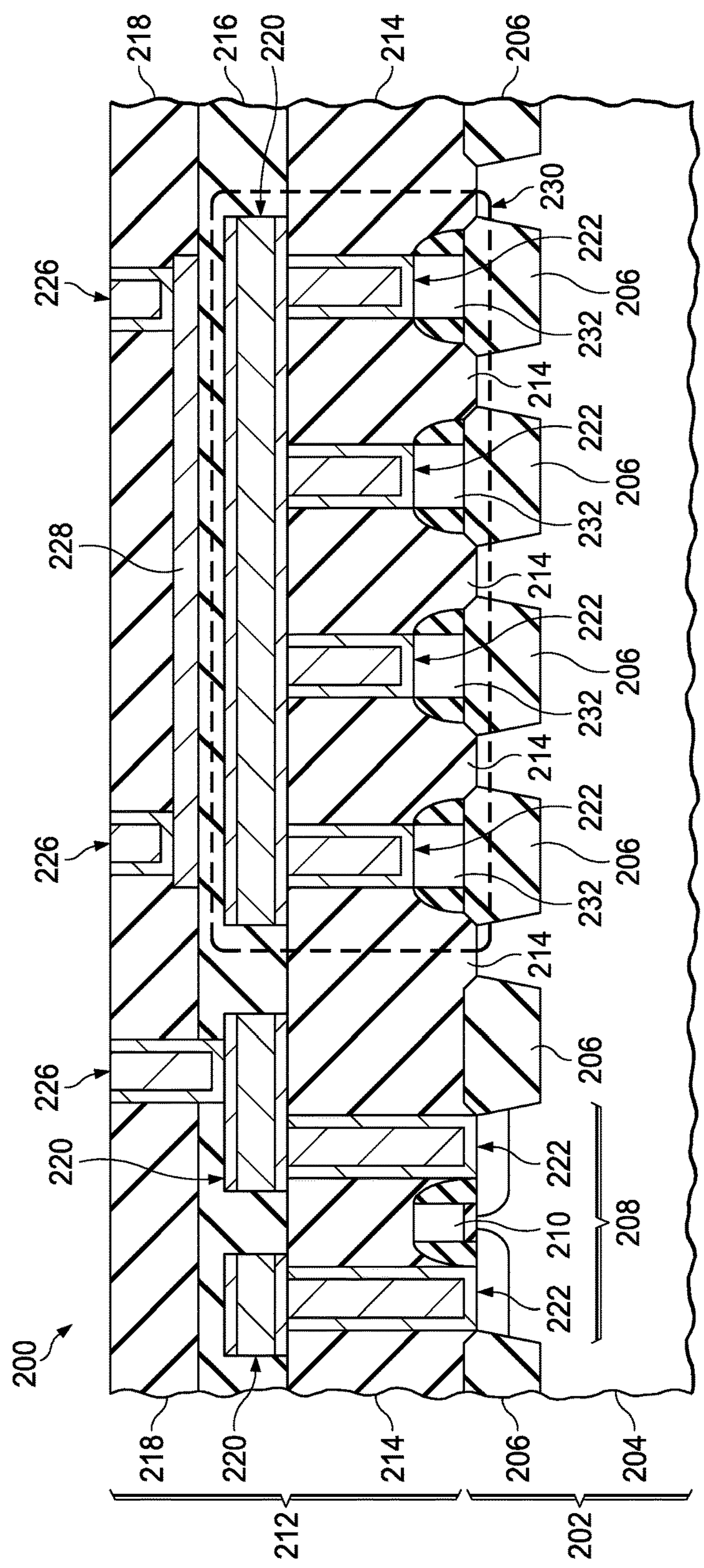

Referring to FIG. 2D, an IMD layer 216 of the interconnect region 212 is formed over the PMD layer 214 and over the first interconnect lines 220. The IMD layer 216 may be formed as a series of dielectric sublayers, including an etch stop layer of silicon nitride formed by a PECVD process using silane and ammonia. The IMD layer 216 may include another sublayer of silicon dioxide or low-k dielectric material on the etch stop layer, formed by a HARP process or by thermal decomposition of hydrogen silsesquioxane (HSQ). The IMD layer 216 may be planarized, as indicated in FIG. 2D, by an oxide CMP process.

A resistor 228 may be formed on the IMD layer 216. The resistor 228 may include a body layer formed by sputtering a thin film layer of resistive material such as nickel chromium, silicon chromium, tantalum nitride, or such, onto the IMD layer 216. The resistor 228 may include resistor heads, not shown in FIG. 2D, formed on the resistor body layer at ends of the resistor 228. The resistor body may be defined by forming an etch mask over the thin film layer followed by a subsequent wet etch or plasma etch process. The resistor 228 is formed so as to be electrically isolated from the thermal conduit 230, for example by a portion of the IMD layer 216 over the thermal conduit 230. A thickness of the IMD layer 216 may be selected to provide a desired isolation from the thermal conduit 230.

An ILD layer 218 is formed over the IMD layer 216 and over the resistor 228. The ILD layer 218 may be formed as a series of dielectric sublayers, including a low-k dielectric layer formed by a PECVD process and a cap layer of material suitable for a CMP stop layer, formed by another PECVD process.

Vias 226 are formed through the ILD layer 218 to the resistor 228, and through the ILD layer 218 and a portion of the IMD layer 216 to instances of the first interconnect lines 220. The instances of the vias 226 to the resistor 228 may optionally be formed concurrently with the instances of the vias 226 to the first interconnect lines 220. The vias 226 may be formed by etching via holes through the ILD layer 218 and the IMD layer 216, and forming a titanium liner, by sputtering or an ionized metal plasma (IMP) process, extending into the via holes. A titanium nitride liner is formed, by reactive sputtering or atomic layer deposition (ALD), on the titanium liner. A layer of tungsten is formed, by a metal organic chemical vapor deposition (MOCVD) process, on the titanium nitride liner, filling the contact holes. The tungsten, titanium nitride and titanium are removed from over a top surface of the ILD layer 218 by a tungsten CMP process, to form the vias 226 with tungsten cores. Alternative, a aluminum may be formed on the titanium nitride liner by a force fill process, to form the vias 226 with aluminum cores.

Forming the gate structure 232 of the thermal conduit 230 concurrently with the gate 210 of the MOS transistor 208, and concurrently with other gates of other MOS transistors, may advantageously reduce fabrication cost and complexity of the integrated circuit 200 compared with forming the gate structure 232 separately from the gate 210 of the MOS transistor 208. Similarly, forming the instances of the contacts 222 of the thermal conduit 230 concurrently with the instances of the contacts 222 connected to the MOS transistor 208 and other components may further reduce fabrication cost and complexity of the integrated circuit 200. Furthermore, forming the instance of the first interconnect line 220 of the thermal conduit 230 concurrently with the instances of the first interconnect lines 220 that are electrically coupled to the MOS transistor 208 and other components may even further reduce fabrication cost and complexity of the integrated circuit 200.

Figure 3:
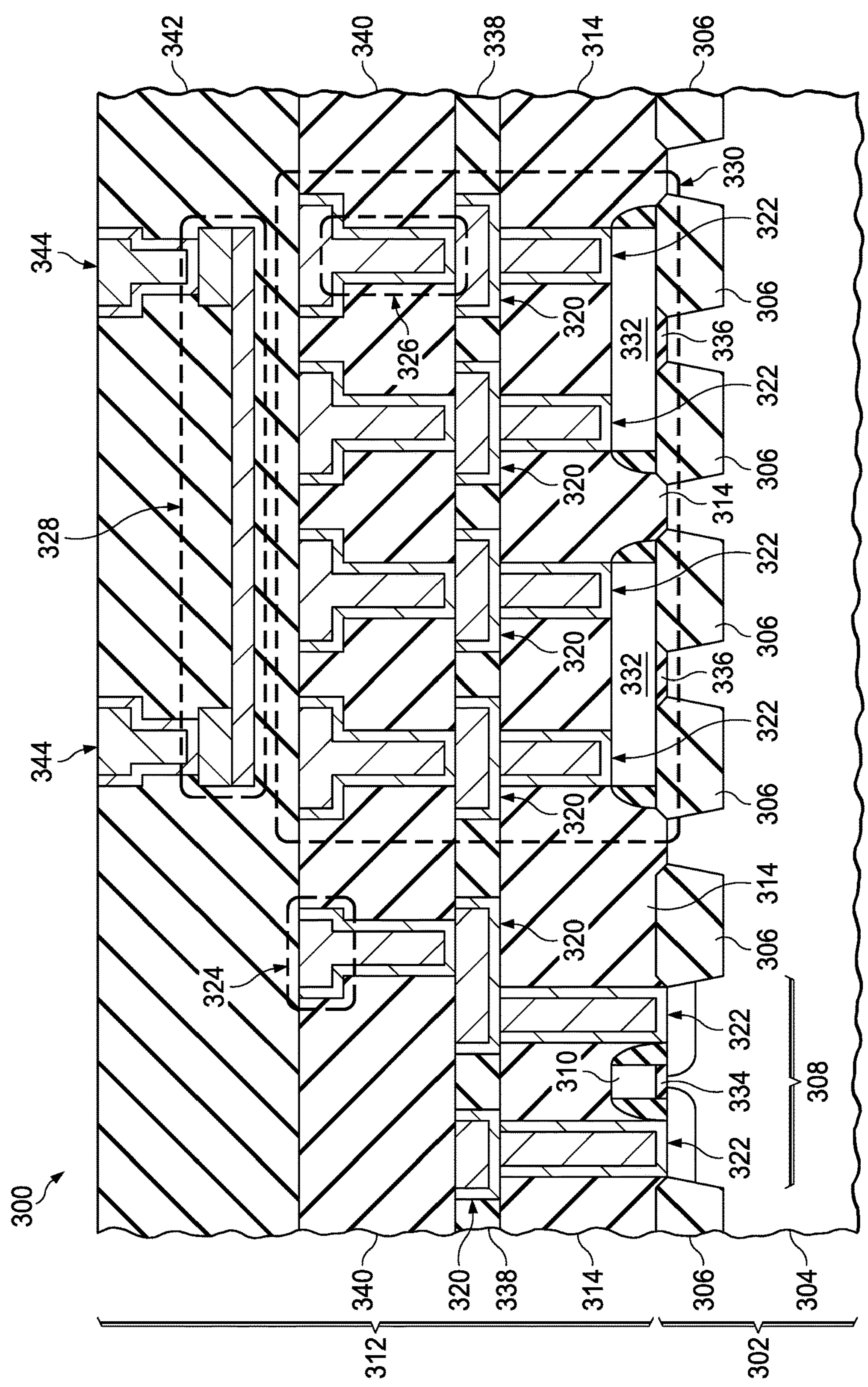
FIG. 3 is a cross section of another example integrated circuit including a resistor and a thermal conduit.

FIG. 3 is a cross section of another example integrated circuit including a resistor and a thermal conduit. The integrated circuit 300 includes a substrate 302 having semiconductor material 304. The substrate 302 may be a portion of a wafer or other suitable structure. In the instant example, field oxide 306 is disposed in and on the substrate 302. The field oxide 306 may have an STI structure, as depicted in FIG. 3, or may have another structure such as a LOCOS structure.

The integrated circuit 300 contains active components, exemplified by an MOS transistor 308. The MOS transistor 308 includes a first gate dielectric layer 334 on the semiconductor material 304 and a gate 310 over the first gate dielectric layer 334.

The integrated circuit 300 further includes a thermal conduit 330 above the substrate 302. In the instant example, instances of the field oxide 306 are located under the thermal conduit 330. Further in the instant example, a second gate dielectric layer 336 is located on the semiconductor material 304 under the thermal conduit 330. The first gate dielectric layer 334 and the second gate dielectric layer 336 have similar thicknesses and compositions, as a result of being formed concurrently.

The thermal conduit 330 includes a gate structure 332 on the second gate dielectric layer 336 and on instances of the field oxide 306. The gate 310 of the MOS transistor 308 and the gate structure 332 have similar structures and compositions, as a result of being formed concurrently.

The integrated circuit 300 includes an interconnect region 312 over the substrate 302. The interconnect region 312 includes a first dielectric layer 314 over the substrate 302. The first dielectric layer 314 may be a PMD layer, as described in reference to FIG. 1. Other structures and compositions for the first dielectric layer 314 are within the scope of the instant example. Contacts 322 are disposed through the first dielectric layer 314. A portion of the contacts 322 make connections to the active components, including the MOS transistor 308. A separate portion of the contacts 322 are part of the thermal conduit 330 and make connections to the gate structure 332. The contacts 322 may have similar structures and compositions to the contacts 122 described in reference to FIG. 1. Alternatively, the contacts 322 of the instant example may have other structures and compositions.

The interconnect region 312 includes a second dielectric layer 338 over the first dielectric layer 314. The second dielectric layer 338 may be an IMD layer for a damascene interconnect level, as depicted in FIG. 3. The integrated circuit 300 includes a first interconnect level containing single damascene interconnect lines 320. The single damascene interconnect lines 320 may have a damascene structure, including a liner of barrier metal such as tantalum nitride along bottoms and sides of the single damascene interconnect lines 320, and fill metal of copper on the liner. Other structures and compositions for the single damascene interconnect lines 320 are within the scope of the instant example. A portion of the single damascene interconnect lines 320 are electrically coupled to the active components, including the MOS transistor 308 through instances of the contacts 322. A separate portion of the single damascene interconnect lines 320 are part of the thermal conduit 330 and make connections to the contacts 322 on the gate structure 332.

The interconnect region 312 includes a third dielectric layer 340 over the second dielectric layer 338. The third dielectric layer 340 may be an ILD layer for dual damascene vias and interconnects, as depicted in FIG. 3. Dual damascene vias 326 and dual damascene interconnect lines 324 are disposed through the third dielectric layer 340. The dual damascene vias 326 and dual damascene interconnect lines 324 have a liner of barrier metal along bottoms and sides of the dual damascene interconnect lines 324 and extending into the dual damascene vias 326, with fill metal of copper on the liner. A portion of the dual damascene vias 326 make electrical connections to the instances of the single damascene interconnect lines 320 that are electrically coupled to the active components, including the MOS transistor 308. A separate portion of the dual damascene vias 326 are part of the thermal conduit 330 and make connections to the instances of the single damascene interconnect lines 320 of the thermal conduit 330. Similarly, a portion of the dual damascene interconnect lines 324 make electrical connections to the instances of the dual damascene vias 326 that are electrically coupled to the active components, including the MOS transistor 308. A separate portion of the dual damascene interconnect lines 324 are part of the thermal conduit 330 and make connections to the instances of the dual damascene vias 326 that are also part of the thermal conduit 330.

The interconnect region 312 of the instant example includes a fourth dielectric layer 342 over the third dielectric layer 340. The fourth dielectric layer 342 may have a layered structure that is formed in segments suitable for forming a resistor 328 encapsulated by the third dielectric layer 340. The resistor 328 is electrically isolated from the thermal conduit 330 by a portion of the third dielectric layer 340 located below the resistor 328. The resistor may include contact heads on a resistor body, as depicted in FIG. 3. Dual damascene structures 344 in the third dielectric layer 340 may provide electrical connections to the resistor 328.

The thermal conduit 330 of the instant example has segmented coverage by the dual damascene interconnect lines 324 under the resistor 328. Greater widths of the dual damascene interconnect lines 324 of the thermal conduit 330, and corresponding lesser spaces between the dual damascene interconnect lines 324 of the thermal conduit 330, increase thermal conduction from the resistor 328 to the thermal conduit 330, and also increase capacitive coupling between the resistor 328 to the thermal conduit 330. The widths and spaces of the dual damascene interconnect lines 324 of the thermal conduit 330 may be selected to provide a desired balance between capacitive loading on the resistor 328 and thermal conduction from the resistor 328 to the thermal conduit 330. The gate structure 332 overlaps the field oxide 306 and the second gate dielectric layer 336. Thermal conduction from the gate structure 332 to the semiconductor material 304 is higher through the second gate dielectric layer 336 than through the field oxide 306. Capacitive coupling from the gate structure 332 to the semiconductor material 304 is also higher through the second gate dielectric layer 336 than through the field oxide 306. A total area of the gate structure 332 over the field oxide 306 and a total area of the gate structure 332 over the second gate dielectric layer 336 may be selected to provide a desired balance between capacitive coupling from the gate structure 332 to the semiconductor material 304, which affects the capacitive loading on the resistor 328, and thermal conduction from the gate structure 332 to the semiconductor material 304, which affects thermal conduction from the resistor 328. For example, instances of the resistor 328 in a high frequency circuit, say operating above 1 gigahertz (GHz), may benefit from reduced capacitive coupling compared to instances of the resistor 328 operated in a direct current (DC) mode.

Figure 4A:
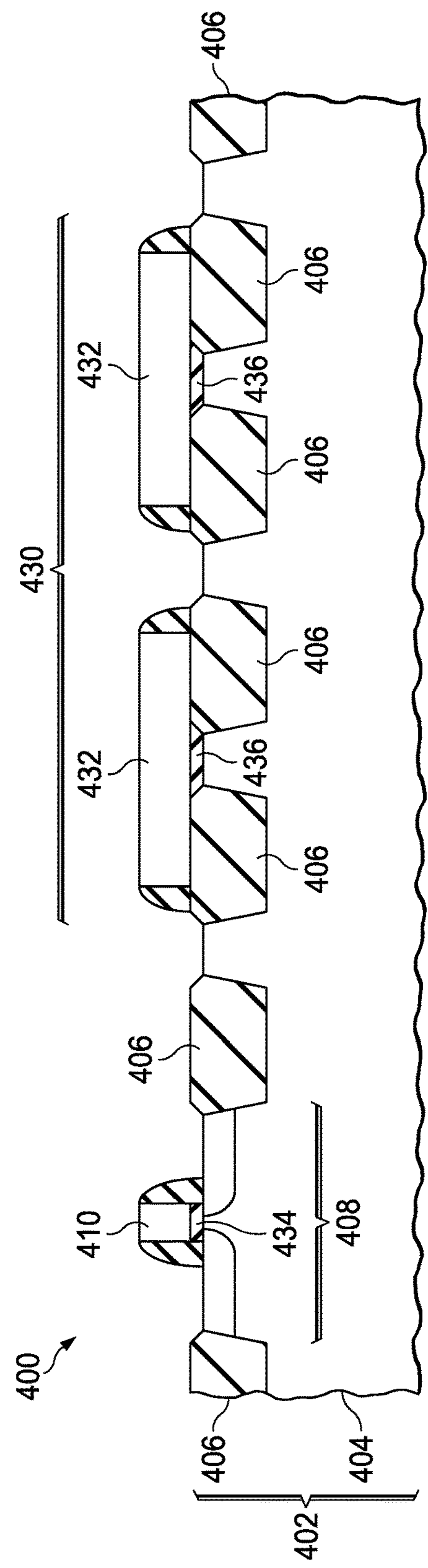
FIG. 4A through FIG. 4E are cross sections of an integrated circuit with a resistor and a thermal conduit under the resistor, depicted in steps of another example method of formation.

FIG. 4A through FIG. 4E are cross sections of an integrated circuit with a resistor and a thermal conduit under the resistor, depicted in steps of another example method of formation. Referring to FIG. 4A, a substrate 402 is provided for formation of the integrated circuit 400. The substrate 402 may be manifested as one of the examples disclosed in reference to FIG. 2A. The substrate 402 includes semiconductor material 404. Field oxide 406 may be formed in the substrate 402, in an area for the thermal conduit 430 and in other areas, for example to laterally isolate components of the integrated circuit 400. The field oxide 406 may be formed, for example, by an STI process or by a LOCOS process. Other methods of forming the field oxide 406 are within the scope of the instant example.

A first gate dielectric layer 434 in an area for an MOS transistor 408, and a second gate dielectric layer 436 in an area for the thermal conduit 430, are formed concurrently on the semiconductor material 404. The first gate dielectric layer 434 and the second gate dielectric layer 436 may be formed, for example by a variety of processes, including thermal oxidation of silicon, nitridation of silicon dioxide, or deposition of high-k material such as hafnium oxide or zirconium oxide.

Components, represented in the instant example by the MOS transistor 408, are formed in and on the substrate 402. A gate 410 of the MOS transistor 408 and a gate structure 432 of the thermal conduit 430 are formed concurrently over the substrate 402. The gate 410 and the gate structure 432 may be formed, for example, by any of the methods described in reference to FIG. 2A. The gate 410 is formed over the first gate dielectric layer 434. In the instant example, the gate structure 432 is formed on at least a portion of the field oxide 406 under the thermal conduit 430 and on at least a portion of the second gate dielectric layer 436.

Figure 4B:
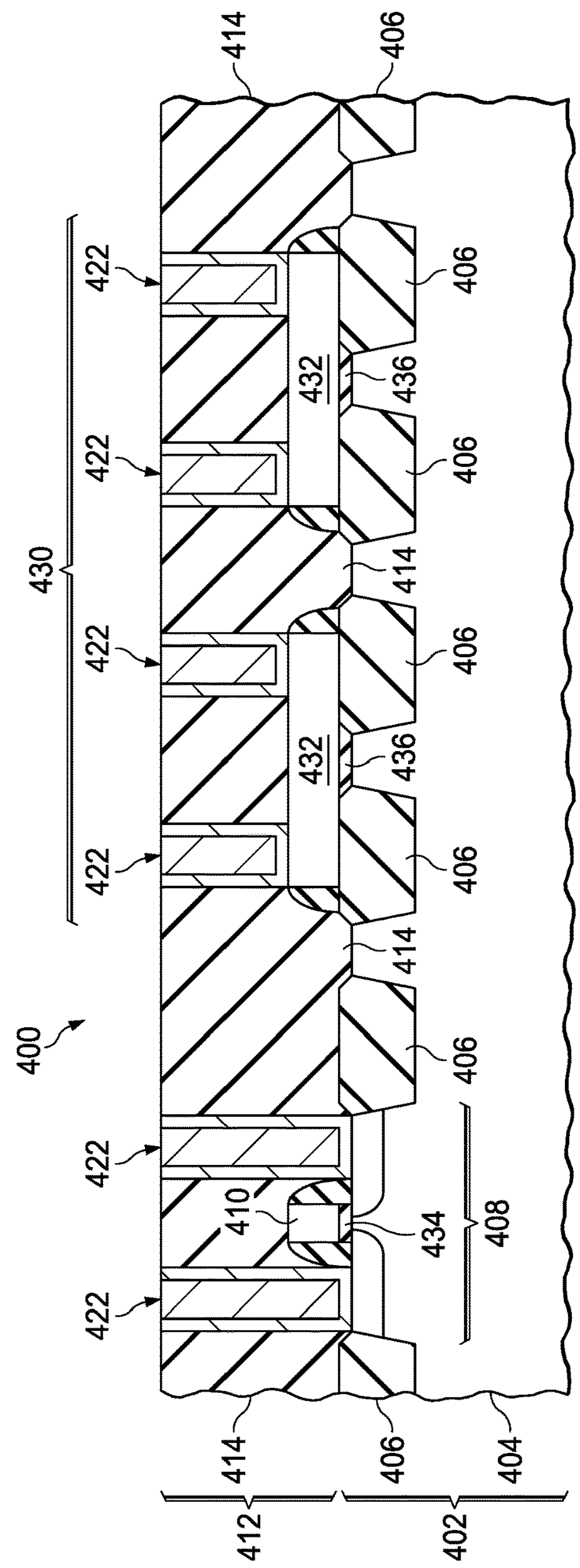

Referring to FIG. 4B, the integrated circuit 400 includes an interconnect region 412 over the substrate 402. A first dielectric layer 414 of the interconnect region 412 is formed over the substrate 402 and over the gate 410 and the gate structure 432. The first dielectric layer 414 may be formed as described in reference to the PMD layer 214 of FIG. 2B. Contacts 422 are formed through the first dielectric layer 414 to make connections to the components such as the MOS transistor 408, and as part of the thermal conduit 430 to make connections to the gate structure 432. The instances of the contacts 422 making connections to the active components, and the instances of the contacts 422 in the thermal conduit 430, are formed concurrently. The contacts 422 may be formed as described in reference to FIG. 2B.

Figure 4C:
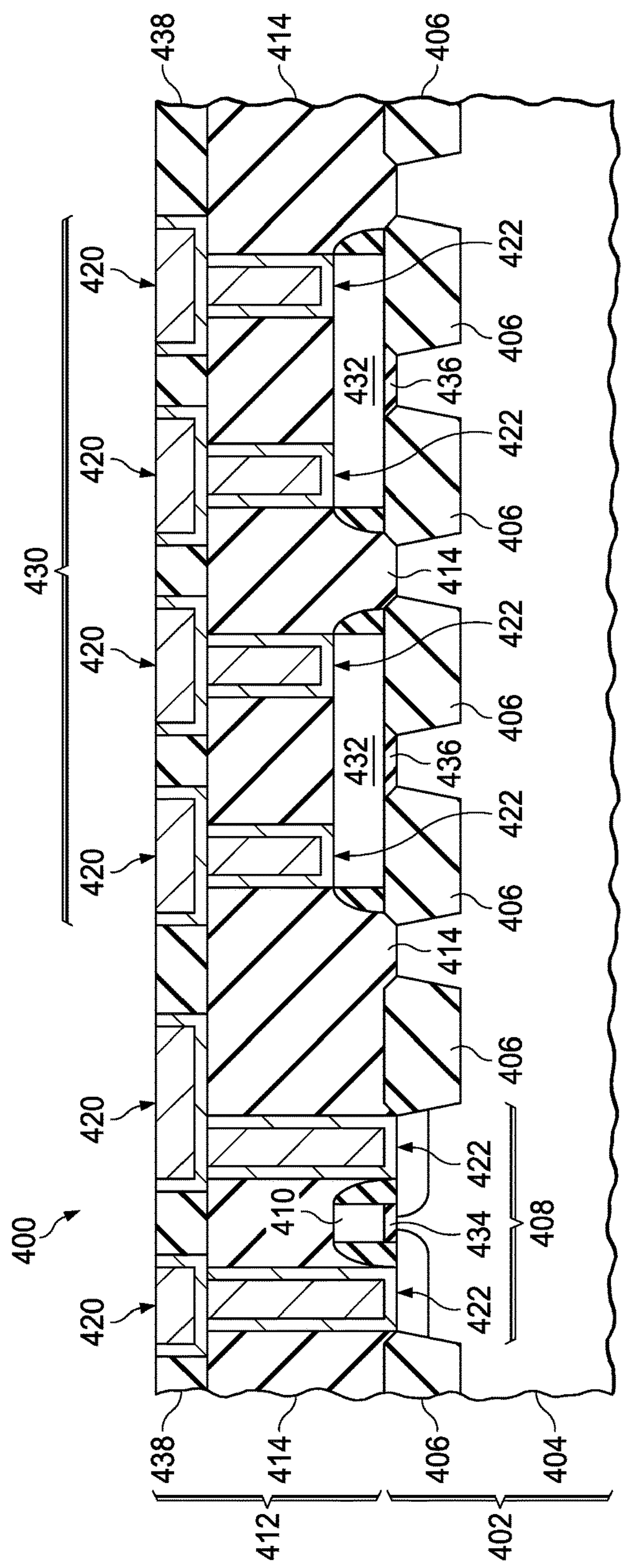

Referring to FIG. 4C, a second dielectric layer 438 is formed over the first dielectric layer 414. The second dielectric layer 438 may include an etch stop layer on the first dielectric layer 414, a main layer of silicon dioxide-based dielectric material, and a CMP stop layer over the main layer. The second dielectric layer 438 may be formed by a series of PECVD processes.

Single damascene interconnect lines 420 are formed in the second dielectric layer 438, making connections to the contacts 422. The single damascene interconnect lines 420 may be formed by etching interconnect trenches through the second dielectric layer 438 so as to expose tops of the contacts 422. A liner of barrier metal, such as tantalum nitride, is formed on the second dielectric layer 438 and extending into the interconnect trenches onto the tops of the contacts 422. The liner may be formed, for example, by a reactive sputter process or an ALD process. A seed layer of copper is formed on the liner by a sputter process, and copper in electroplated on the seed layer to fill the interconnect trenches. The electroplated copper, the seed layer, and the liner are removed from over the second dielectric layer 438 by a single damascene copper CMP process, leaving the single damascene interconnect lines 420 in the interconnect trenches. The single damascene interconnect lines 420 include instances which are electrically coupled to the active components of the integrated circuit 400, and instances which are part of the thermal conduit 430, all of which are formed concurrently. The single damascene copper CMP process may be sensitive to lateral dimensions of the single damascene interconnect lines 420, in that instances of the single damascene interconnect lines 420 having widths greater than, say, 20 microns or 30 microns, may overpolish, or "dish," during the single damascene copper CMP process. To avoid overpolished instances of the single damascene interconnect lines 420, widths of the single damascene interconnect lines 420 may be designed to be less than a prescribed limit, or slots may be designed in the single damascene interconnect lines 420. Thus, an area density of the single damascene interconnect lines 420 in the thermal conduit 430 may be less than 100 percent.

Figure 4D:
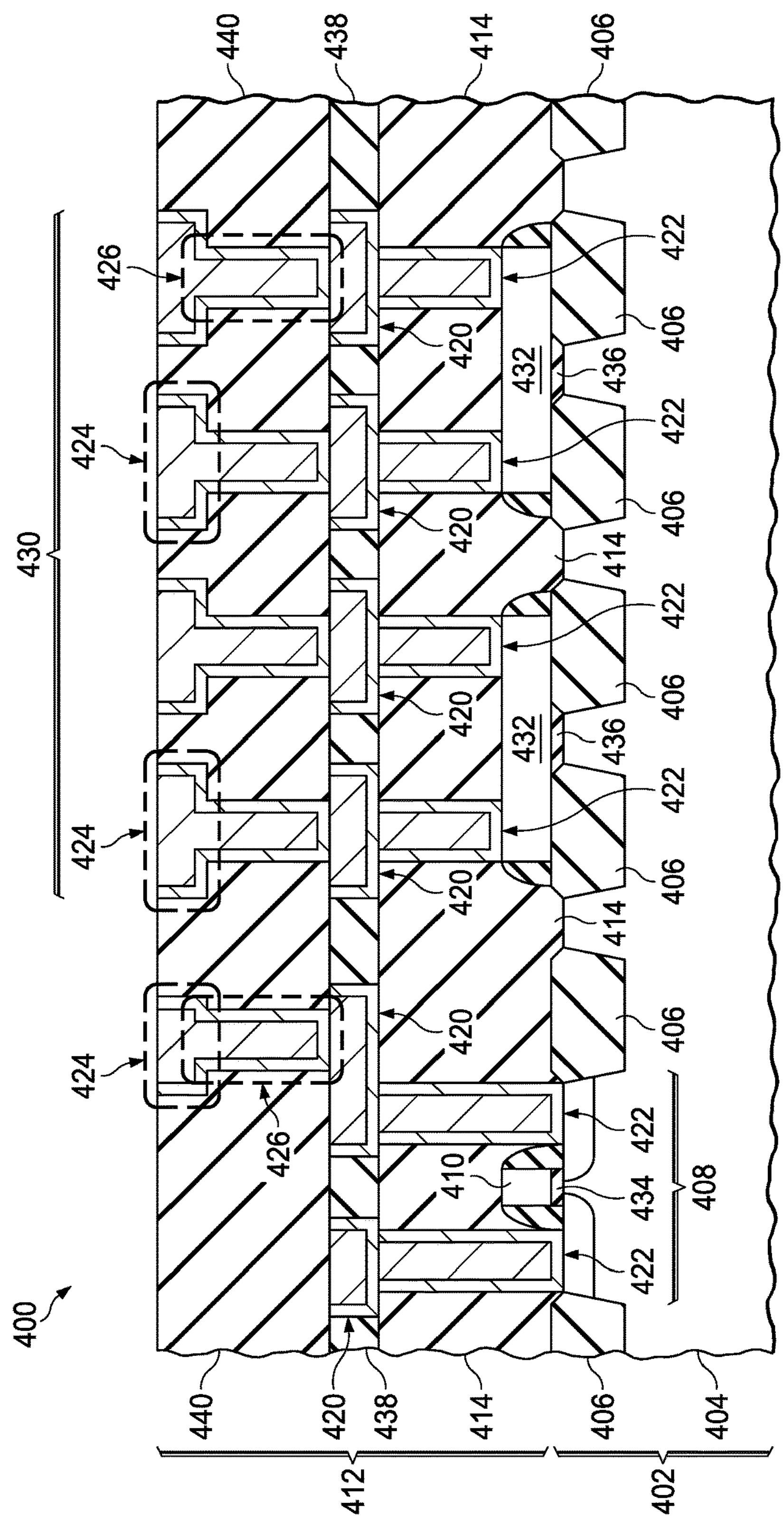

Referring to FIG. 4D, a third dielectric layer 440 of the interconnect region 412 is formed over the second dielectric layer 438 and over the single damascene interconnect lines 420. The third dielectric layer 440 may include an etch stop layer on the second dielectric layer 438 and the single damascene interconnect lines 420, a main layer of low-k dielectric material such as organosilicate glass (OSG), and a CMP stop layer over the main layer. The third dielectric layer 440 may be formed by a series of PECVD processes. Dual damascene interconnect lines 424 and dual damascene vias 426 are formed through the third dielectric layer 440 by a dual damascene process. An example dual damascene process may begin by forming interconnect trenches combined with via holes in the third dielectric layer 440. The interconnect trenches and via holes may be formed, for example, by a trench-first sequence, a via-first sequence, or a partial via-first sequence. The interconnect trenches extend partway through the third dielectric layer 440, and the via holes extend from bottoms of the interconnect trenches to the single damascene interconnect lines 420. A liner of barrier metal is formed over the third dielectric layer 440, extending into the interconnect trenches and via holes to the single damascene interconnect lines 420. The liner may have a similar composition and thickness to the liner of the single damascene interconnect lines 420. A seed layer of copper is formed on the liner by a sputter process, and copper is electroplated on the seed layer to fill the via holes and interconnect trenches. The electroplated copper, seed layer and liner are removed from over the third dielectric layer 440 by a dual damascene copper CMP process, similar to the single damascene copper CMP process, to form the dual damascene interconnect lines 424 in the interconnect trenches and the dual damascene vias 426 in the via holes. The dual damascene interconnect lines 424 and the dual damascene vias 426 include instances which are electrically coupled to the active components of the integrated circuit 400, and instances which are part of the thermal conduit 430, all of which are formed concurrently. An area density of the dual damascene interconnect lines 424 is selected to provide process latitude for the dual damascene copper CMP process, using similar guidelines to those employed for the single damascene interconnect lines 420. Furthermore, the area density of the dual damascene interconnect lines 424 in the thermal conduit 430 may be designed to provide a desired balance between thermal conductivity from the subsequently-formed resistor to the thermal conduit 430, capacitive loading on the resistor by the thermal conduit 430, and process latitude for the dual damascene copper CMP process. The area density of the dual damascene interconnect lines 424 in the thermal conduit 430 may be 50 percent to 150 percent of an average area density of the dual damascene interconnect lines 424 in the integrated circuit 400, which has been demonstrated to provide sufficient process latitude for the dual damascene copper CMP process.

Figure 4E:
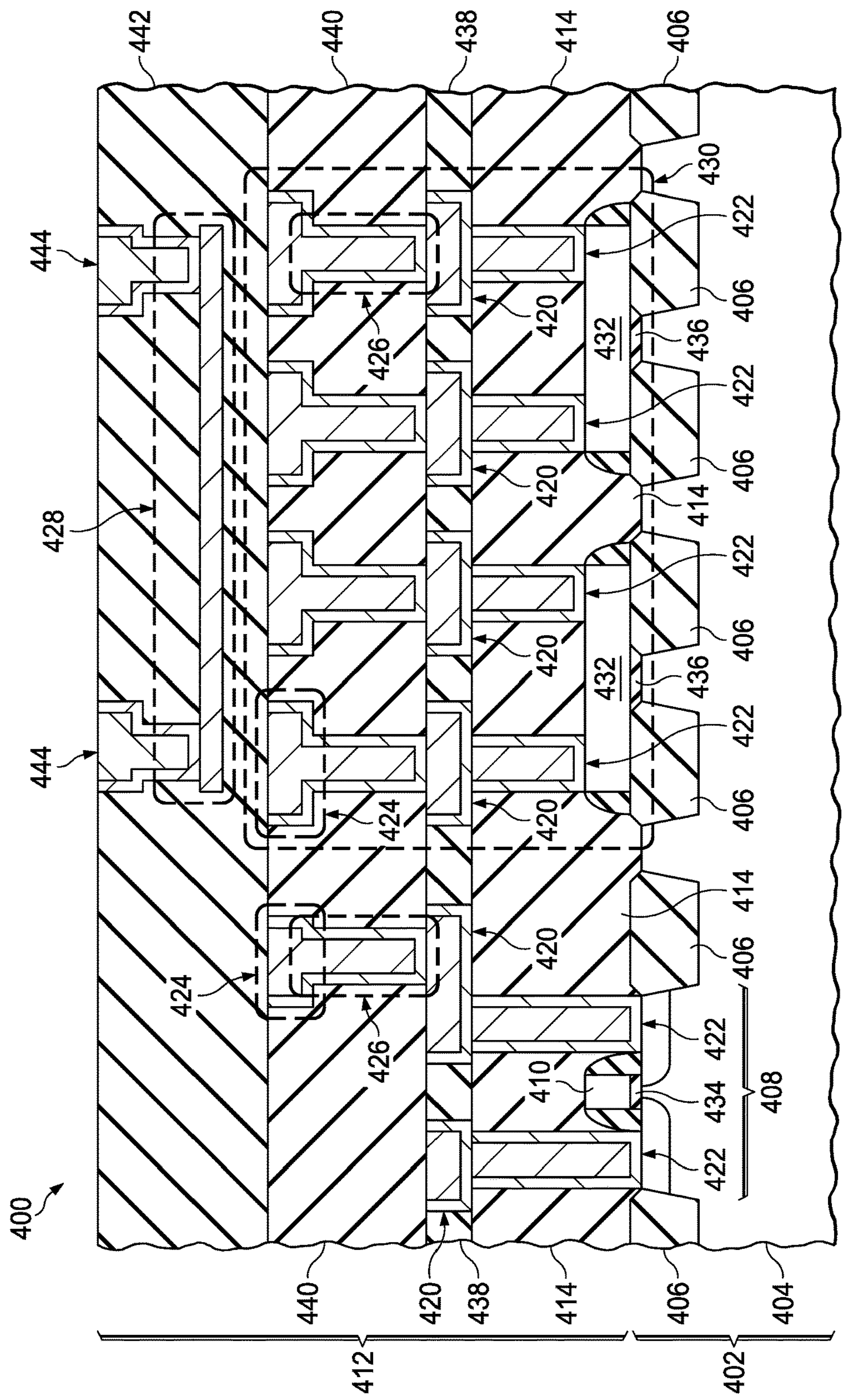

Referring to FIG. 4E, a fourth dielectric layer 442 of the interconnect region 412 is formed over the third dielectric layer 440 and over the dual damascene interconnect lines 424. The resistor 428 is formed in the fourth dielectric layer 442 so as to be electrically isolated from the thermal conduit 430. This may be attained, for example, by forming a dielectric sub-layer of the fourth dielectric layer 442 over the third dielectric layer 440 and over the dual damascene interconnect lines 424, and forming the resistor 428 on the dielectric sub-layer. Electrical connections 444 are formed to the resistor 428, such as dual damascene interconnects and vias, as depicted in FIG. 4D. Other types of electrical connections to the resistor 428 are within the scope of the instant example.

Forming the members of the thermal conduit 430, including the gate structure 432, the contacts 422, the single damascene interconnect lines 420, the dual damascene interconnect lines 424, and the dual damascene vias 426, concurrently with the corresponding members that are electrically coupled to the active components of the integrated circuit 400, may accrue the same benefits of reduced fabrication cost and complexity discussed in reference to FIG. 1. In the instant example, the dual damascene vias 426 and the dual damascene interconnect lines 424 may be formed as single damascene vias and single damascene interconnect lines, retaining the same benefits of reduced fabrication cost and complexity.

Figure 5:
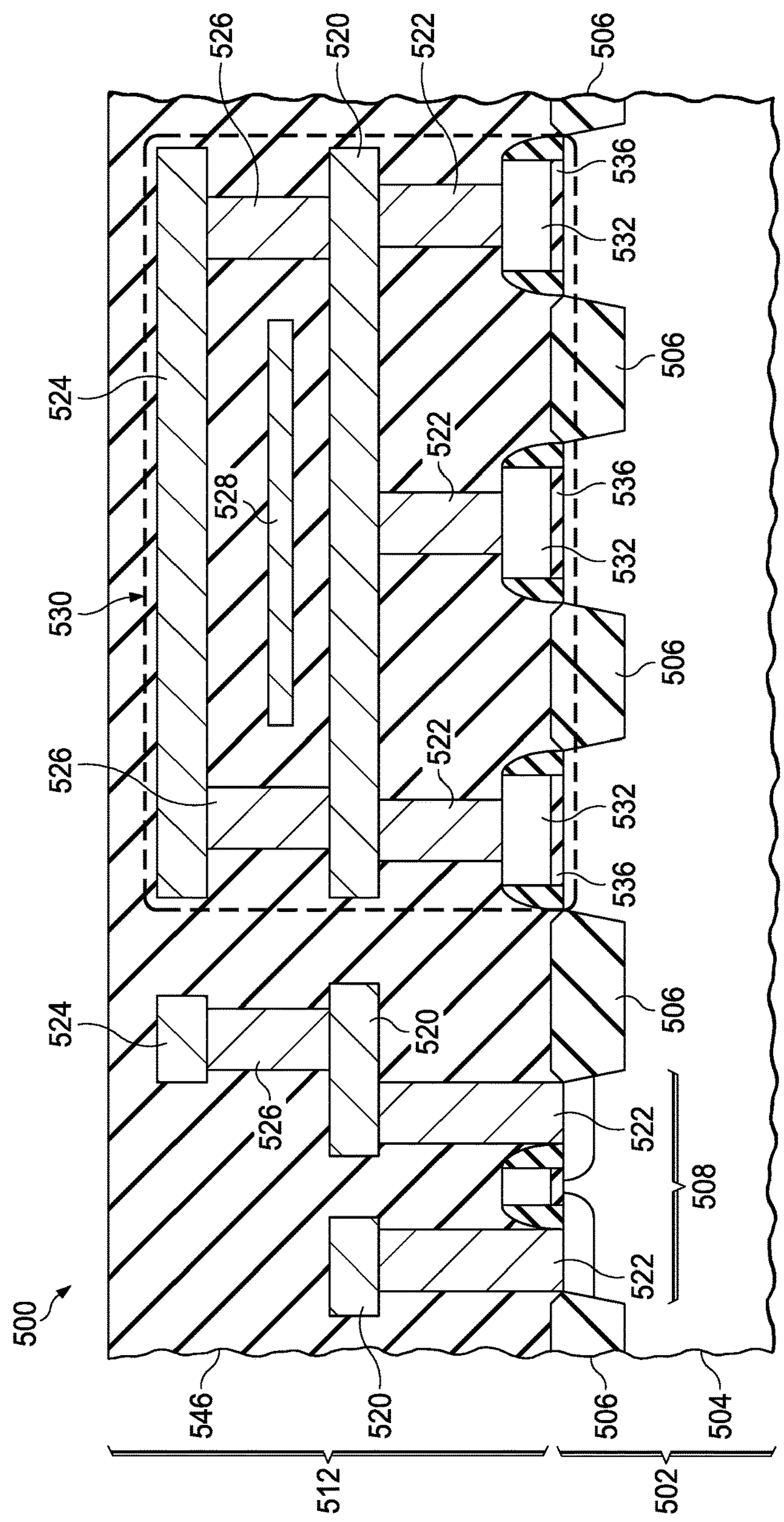
FIG. 5 is a cross section of a further example integrated circuit including a resistor and a thermal conduit.

FIG. 5 is a cross section of a further example integrated circuit including a resistor and a thermal conduit. The integrated circuit 500 has a substrate 502 which includes semiconductor material 504 and may include field oxide 506. The integrated circuit 500 includes an active component 508. The integrated circuit 500 further includes an interconnect region 512 over the substrate 502. The interconnect region 512 includes a dielectric layer stack 546 having a plurality of dielectric sub-layers. The interconnect region 512 further includes contacts 522, first interconnect lines 520, vias 526 and second interconnect lines 524 disposed in the dielectric layer stack 546. Some instances of the contacts 522, first interconnect lines 520, vias 526 and second interconnect lines 524 provide electrical connections to the active component 508.

The integrated circuit 500 includes a resistor 528 in the interconnect region 512. In the instant example, the resistor 528 may be located higher in the interconnect region 512 than the first interconnect lines 520 and lower than the second interconnect lines 524. Electrical connections to the resistor 528 are out of the plane of FIG. 5, and are thus not shown in FIG. 5.

The integrated circuit 500 further includes a thermal conduit 530. In the instant example, the thermal conduit 530 includes a gate structure 532 disposed on a thin dielectric layer 536 on the semiconductor material 504 below the resistor 528. The thin dielectric layer 536 is significantly thinner than the field oxide 506, for example the thin dielectric layer 536 may have a thickness less than 10 percent of a thickness of the field oxide 506. Disposing the gate structure 532 on the thin dielectric layer 536 may advantageously increase a thermal conductivity from the thermal conduit 530 to the semiconductor material 504 compared to a thermal conduit disposed only on the field oxide 506. The thin dielectric layer 536 may include one or more dielectric materials with high thermal conductivity, such as diamond, boron nitride, beryllium oxide, aluminum nitride, or such. The thin dielectric layer 536 may be formed by a chemical vapor deposition (CVD) process or such.

The thermal conduit 530 includes instances of the contacts 522 making connections to the gate structure 532, one or more instances of the first interconnect lines 520 making connections to the contacts 522 of the thermal conduit 530, instances of the vias 526 making connections to the first interconnect lines 520 of the thermal conduit 530, and one or more instances of the second interconnect lines 524 making connections to the vias 526 of the thermal conduit 530. The first interconnect lines 520 of the thermal conduit 530 extend under the resistor 528. In the instant example, the thermal conduit 530 may extend at least partway over the resistor 528, as indicated in FIG. 5, which may advantageously conduct a larger portion of heat generated by the resistor 528 and compared to a thermal conduit that only extends under the resistor 528.

Figure 6:
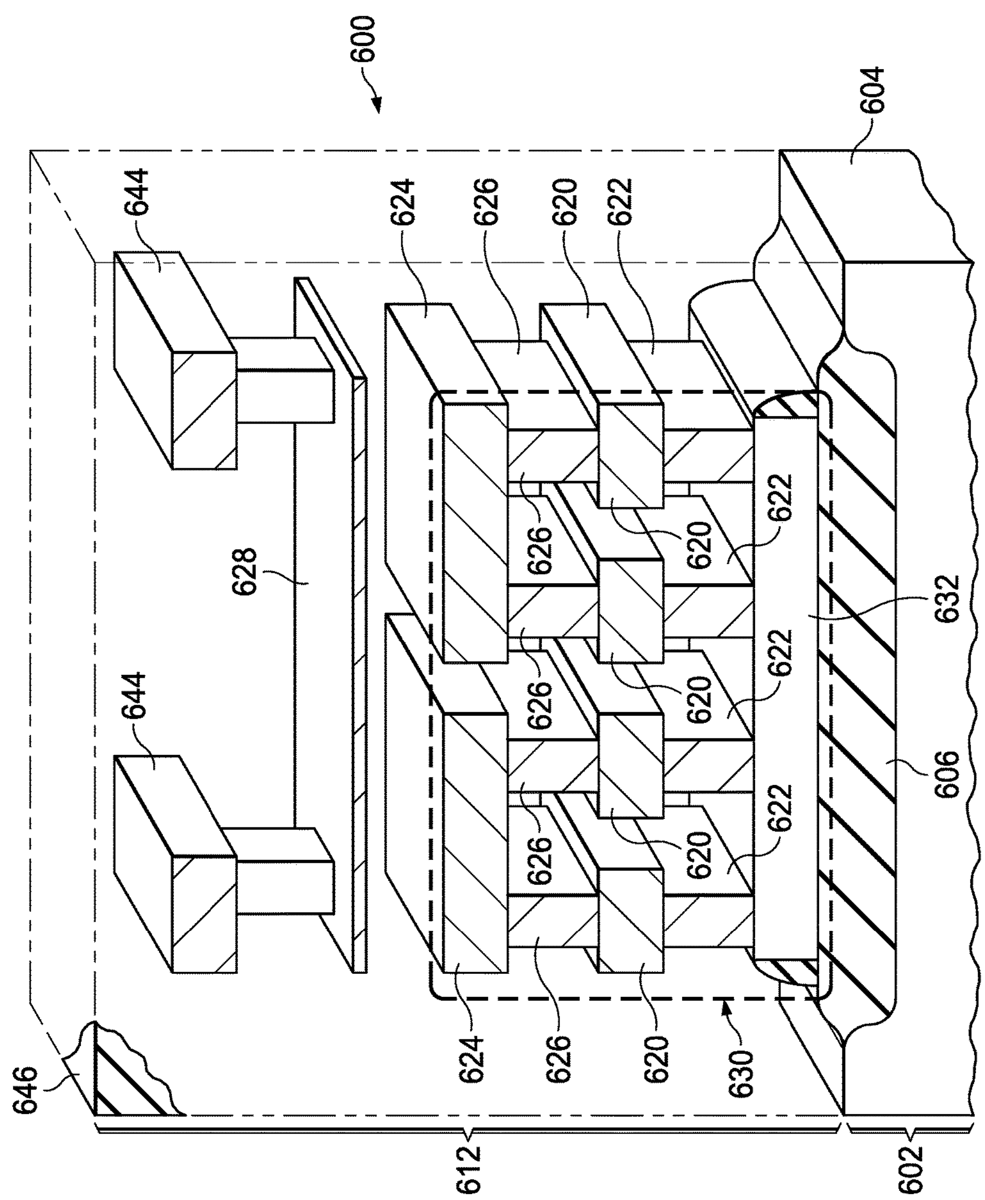
FIG. 6 is a cross section of another example integrated circuit including a resistor and a thermal conduit.

FIG. 6 is a cross section of another example integrated circuit including a resistor and a thermal conduit. The integrated circuit 600 has a substrate 602 which includes semiconductor material 604 field oxide 606. In the instant example, the field oxide 606 may have a LOCOS structure. The integrated circuit 600 includes at least one active component, not shown in FIG. 6. The integrated circuit 600 further includes an interconnect region 612 over the substrate 602. The interconnect region 612 includes a dielectric layer stack 646.

A resistor 628 is disposed in the dielectric layer stack 646. Electrical connections 644 to the resistor 628 are also disposed, at least partially, in the dielectric layer stack 646. A thermal conduit 630 is disposed in the interconnect region 612, at least partially under the resistor 628, extending down to the field oxide 606. The thermal conduit 630 includes a gate structure 632, one or more contacts 622, one or more first interconnect lines 620, one or more vias 626 and one or more second interconnect lines 624 disposed in the dielectric layer stack 646. The gate structure 632 is disposed on the field oxide 606 and is thermally coupled to the semiconductor material 604 through the field oxide 606, while being electrically isolated from the semiconductor material 604. The contacts 622, first interconnect lines 620, vias 626, and second interconnect lines 624 of the thermal conduit 630 are connected in sequence to the gate structure 632. The thermal conduit 630 is electrically isolated from the resistor 628.

In the instant example, one or more of the contacts 622 of the thermal conduit 630 may be stretch contacts 622, in which a lateral length of each stretch contact 622 is at least twice a lateral width of the stretch contact 622, as indicated in FIG. 6. The lateral length and lateral width of each stretch contact 622 extend laterally along a top of the stretch contact 622 in contact with a corresponding first interconnect line 620. The integrated circuit 600 includes additional contacts, not shown, to provide electrical connections to the at least one active component. The additional contacts may have lateral lengths and lateral widths that are substantially equal, which is a commonly used configuration for contacts. The stretch contacts 622 may advantageously provide more thermal conduction from the second interconnect lines 624 of the thermal conduit 630 to the gate structure 632 compared to contacts having equal lateral lengths and lateral widths.

In the instant example, one or more of the vias 626 of the thermal conduit 630 may be stretch vias 626, in which a lateral length of each stretch via 626 is at least twice a lateral width of the stretch via 626, as indicated in FIG. 6. The lateral length and lateral width of each stretch via 626 extend laterally along a top of the stretch via 626 in contact with a corresponding second interconnect line 624. The integrated circuit 600 includes additional vias, not shown, to provide electrical connections to the at least one active component. The additional contacts may have lateral lengths and lateral widths that are substantially equal, which is a commonly used configuration for vias. The stretch vias 626 may advantageously provide more thermal conduction from the second interconnect lines 624 of the thermal conduit 630 to the gate structure 632 compared to vias having equal lateral lengths and lateral widths.

Various features of the examples disclosed herein may be combined in other manifestations of example integrated circuits. For example, the structures of FIG. 1 or FIG. 5 may have damascene interconnect lines as described in reference to FIG. 3. Similarly, the structures of FIG. 3 or FIG. 5 may have aluminum interconnect lines as described in reference to FIG. 1. Furthermore, the structures of FIG. 1, FIG. 3, or FIG. 5 may have stretch vias or stretch contacts as described in reference to FIG. 6. For another example, each of the structures of FIG. 1, FIG. 3, FIG. 5, or FIG. 6 may have a version of the thermal conduit with a gate structure similar to any of the gate structures of FIG. 1, FIG. 3, FIG. 5, or FIG. 6. Furthermore, the structures of FIG. 1, FIG. 3, or FIG. 6 may have versions of the thermal conduits which extend over the resistors, as described in reference to FIG. 5. The structures of FIG. 1, FIG. 3, FIG. 5, or FIG. 6 may have versions of the thermal conduits with gate structures over any combination of dielectric layers having STI structures, LOCOS structures, structures similar to gate dielectric layers, or thermal oxide layers.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
- a substrate including a semiconductor material;
- an interconnect region above the substrate, the interconnect region including:
  - at least one interconnect level, each interconnect level including interconnect lines; and
  - vertical interconnects connected to the interconnect lines;
- at least one active component;
- a resistor in the interconnect region higher than the first interconnect level; and
- an electrically isolated thermal conduit in the interconnect region at least partially under the resistor, the electrically isolated thermal conduit being electrically isolated from the resistor, from the semiconductor material, and from all the active components of the integrated circuit, the electrically isolated thermal conduit including:
  - at least one interconnect line of every interconnect level lower than the resistor located at least partially under the resistor;
  - a gate structure on a dielectric layer on the semiconductor material; and
  - at least one of the vertical interconnects connecting the at least one interconnect line to the gate structure at a location under the resistor.

2. The integrated circuit of claim 1, wherein the dielectric layer includes field oxide.

3. The integrated circuit of claim 2, wherein the field oxide has a local oxidation of silicon (LOCOS) structure.

4. The integrated circuit of claim 2, wherein the field oxide has a shallow trench isolation (STI) structure.

5. The integrated circuit of claim 4, wherein an area density of the field oxide under the gate structure is 50 percent to 150 percent of an average area density of field oxide in the integrated circuit.

6. The integrated circuit of claim 1, wherein the dielectric layer includes a gate dielectric layer.

7. The integrated circuit of claim 1, wherein the gate structure includes polycrystalline silicon.

8. The integrated circuit of claim 1, wherein an area density of the gate structure is 50 percent to 150 percent of an average area density of gates in the integrated circuit.

9. The integrated circuit of claim 1, wherein the interconnect lines of at least one of the interconnect levels lower than the resistor include an aluminum layer.

10. The integrated circuit of claim 1, wherein the interconnect lines of at least one of the interconnect levels lower than the resistor include copper and have damascene structures.

11. The integrated circuit of claim 1, wherein the thermal conduit includes interconnect lines of at least two interconnect levels lower than the resistor.

12. The integrated circuit of claim 1, wherein the electrically isolated thermal conduit includes interconnect lines over the resistor.

13. The integrated circuit of claim 1, wherein the thermal conduit includes stretch contacts on the gate structure.

14. The integrated circuit of claim 1, wherein the thermal conduit includes stretch vias connecting the interconnect lines of the thermal conduit.

15. An integrated circuit, comprising:
- a substrate including a semiconductor material;

an interconnect region above the substrate, the interconnect region including:

at least one interconnect level, each interconnect level including interconnect lines; and vertical interconnects connected to the interconnect lines;

at least one active component;

a resistor in the interconnect region higher than the first interconnect level; and an electrically isolated thermal conduit in the interconnect region at least partially under the resistor, the electrically isolated thermal conduit being electrically isolated from the resistor, from the semiconductor material, and from all the active components of the integrated circuit, the electrically isolated thermal conduit including each of the following at least partially under the resistor:

at least one interconnect line of every interconnect level lower than the resistor;

a gate structure on a dielectric layer on the semiconductor material; and a plurality of the vertical interconnects connecting the at least one interconnect line to the gate structure.

* * * * *